(12) United States Patent
Kaga et al.

(10) Patent No.: US 8,563,869 B2
(45) Date of Patent: Oct. 22, 2013

(54) CIRCUIT BOARD AND SEMICONDUCTOR MODULE USING THIS, PRODUCTION METHOD FOR CIRCUIT BOARD

(75) Inventors: Youichirou Kaga, Saitama (JP); Hisayuki Imamura, Saitama (JP); Junichi Watanabe, Saitama (JP)

(73) Assignee: Hitachi Metals, Ltd., Tokyo (JP)

( * ) Notice: Subject to any disclaimer, the term of this patent is extended or adjusted under 35 U.S.C. 154(b) by 1044 days.

(21) Appl. No.: 12/065,009

(22) PCT Filed: Aug. 17, 2006

(86) PCT No.: PCT/JP2006/316154
§ 371 (c)(1),
(2), (4) Date: Feb. 27, 2008

(87) PCT Pub. No.: WO2007/026547
PCT Pub. Date: Mar. 8, 2007

(65) Prior Publication Data
US 2009/0101392 A1    Apr. 23, 2009

(30) Foreign Application Priority Data

Aug. 29, 2005 (JP) ................................. 2005-247301
Mar. 29, 2006 (JP) ................................. 2006-091408

(51) Int. Cl.
| | |
|---|---|
| H05K 1/00 | (2006.01) |
| H05K 7/20 | (2006.01) |
| H01L 23/00 | (2006.01) |
| H01R 43/00 | (2006.01) |
| B23K 31/02 | (2006.01) |

(52) U.S. Cl.
USPC ........... 174/255; 174/252; 361/704; 361/720; 257/703; 257/717; 29/825; 29/829; 29/846; 228/122.1

(58) Field of Classification Search
None
See application file for complete search history.

(56) References Cited

U.S. PATENT DOCUMENTS

| | | | |
|---|---|---|---|
| 5,672,435 A | 9/1997 | Born et al. | |
| 5,767,028 A | 6/1998 | Komatsu et al. | |

(Continued)

FOREIGN PATENT DOCUMENTS

| | | |
|---|---|---|
| EP | 1 201 623 A2 | 5/2002 |
| JP | 2001-010865 | 1/2001 |

(Continued)

OTHER PUBLICATIONS

Ding-Fwu Lii et al.; The Mechanical Properties of AlN/Al Composites Manufactured by Squeeze Casting; Journal of European Ceramic Society; 2002; 253-261; 22; Elsevier Science Ltd.

*Primary Examiner* — Jayprakash N Gandhi
*Assistant Examiner* — Dion Ferguson
(74) *Attorney, Agent, or Firm* — Paul F. Neils; Edwards Neils PLLC (57) ABSTRACT

A circuit board and a semiconductor module with high endurance against thermal cycles, and which is hard to be broken under thermal cycles, even if thick metal circuit board and thick metal heat sink are used, corresponding to high power operation of a semiconductor chip are provided. This circuit board includes, an insulating-ceramic substrate, a metal circuit plate bonded to one face of the insulating-ceramic substrate, a metal heat sink bonded to another face of the insulating-ceramic substrate, wherein $(t_1^2 - t_2^2)/t_c^2/K < 1.5$, where, a thickness of the insulating ceramics substrate is $t_c$, a thickness of the metal circuit plate is $t_1$, a thickness of the metal heat sink is $t_2$, and an internal fracture toughness value of the insulating ceramics substrate is K.

10 Claims, 9 Drawing Sheets

(56) References Cited

U.S. PATENT DOCUMENTS

| | | |
|---|---|---|
| 5,820,965 A | 10/1998 | Pyzik et al. |
| 6,054,762 A | 4/2000 | Sakuraba et al. |
| 6,103,354 A * | 8/2000 | Araki et al. .................. 428/210 |
| 6,417,563 B1 * | 7/2002 | Halderman et al. .......... 257/718 |
| 6,613,443 B2 * | 9/2003 | Komatsu et al. .............. 428/469 |
| 7,031,166 B2 * | 4/2006 | Imamura et al. ............. 361/750 |
| 7,143,929 B2 * | 12/2006 | Furukuwa .................... 228/246 |

FOREIGN PATENT DOCUMENTS

| | | |
|---|---|---|
| JP | 2002-201075 | 7/2002 |
| JP | 2004-80063 | 3/2004 |
| JP | 2004-119568 | 4/2004 |
| JP | 2005-26252 | 1/2005 |

* cited by examiner

CIRCUIT BOARD AND SEMICONDUCTOR MODULE USING THIS, PRODUCTION METHOD FOR CIRCUIT BOARD

BACKGROUND OF THE INVENTION

1. Field of the Invention

This invention relates to a circuit board, especially to a circuit board used for a power semiconductor module, in which a metal circuit plate which acts as a conductive circuit plate is bonded to one face of an insulating-ceramic substrate, and a metal heat sink is bonded to another face. Especially this art can be applied effectively to a power semiconductor module for which high reliability against thermal cycles is demanded.

2. Description of the Related Art

In recent years, power semiconductor modules (IGBTs, power MOSFETs, etc.) which work at high voltage, or at high current, are used as an inverter for electric vehicles. As a substrate used for the power semiconductor module, a circuit board in which a conductive metal plate (metal circuit plate) is bonded to one face (upper face) as a circuit, and a metal plate for heat dissipation (metal heat sink) to another face (lower face), of an insulating-ceramic substrate which is composed of aluminum nitride or silicon nitride ceramics, is used widely. A copper plate or an aluminum plate is used as these metal plates and semiconductor devices, etc., are mounted on the upper face of the metal circuit plate. An active metal brazing method in which a metal brazing material is used, or a direct bonding copper method namely, by which a copper plate is bonded directly, is used for bonding the metal plates to the insulating ceramics.

However, in the power semiconductor module using the circuit board in which the metal circuit plate and the metal heat sink are bonded to the insulating-ceramic substrate, thickness of the metal circuit board and of the metal heat sink may be made comparatively thick at 0.5 mm or larger, so that high current can be sent. In this case, when copper with high thermal conductivity is used especially for both the metal circuit plate and the metal heat sink, thermal expansion coefficients of these are different from the insulating ceramics greatly (for example, $3.0 \times 10^{-6}$/K for silicon nitride ceramics, and $16.7 \times 10^{-6}$/K for copper). Therefore, high thermal stress occurs in cooling process after the bonding, or by thermal cycles during operation of the power semiconductor module. This stress exists as compressive or tensile residual stress near the bonded part of the insulating-ceramic substrate. This residual stress may make the insulating-ceramic substrate cracked, or may be a cause of poor electrical isolation, or delamination of the metal circuit plate or the metal heat sink.

Actually, for such a circuit board, a reliability with which efficient thermal radiation is kept against predetermined thermal cycles from –55° C. to 150° C., is needed. Endurance against 200 thermal cycles or more, 1000 thermal cycles or more, or also 3000 thermal cycles or more, is needed depending on the applied field. When especially used for a hybrid car, an electric vehicle, a train, an airplane, etc., high-reliability against the thermal cycle is needed.

From this point of view, although an aluminum nitride substrate has high thermal conductivity, since mechanical strength and fracture toughness are low and it is not reliable, it is difficult to use it as the insulating ceramic substrate. Since silicon nitride substrate has thermal conductivity comparatively high as the insulating ceramic substrate, and has also high mechanical property, it is thought that a reliable circuit board can be made using it.

However, even when the silicon nitride substrate with high mechanical property is used as the insulating-ceramic substrate, a crack may have been generated by the thermal stress during the heat cycles.

Mostly, this crack may have been generated in the peripheral parts of the pattern of the metal circuit plate, especially in the corners, and this crack may have degraded the isolation voltage and mechanical strength of the silicon nitride substrate, and when voltage was applied to the mounted semiconductor chip, the silicon nitride substrate may have been broken down electrically. Therefore, the reliability of the semiconductor module in which semiconductor chip is mounted on such a circuit board, was not enough.

As an art in the circuit board which is aimed to improve the reliability against the thermal cycles, the art making the fracture toughness value of the silicon nitride substrate higher than $6.5 \text{ MPa·m}^{1/2}$, is indicated by patent documents 1 (JP 2002-201075 A). Here, while setting three point bending flexural strength of the used silicon nitride substrate at 500 MPa or higher, and also setting the fracture toughness value of that at $6.5 \text{ MPa·m}^{1/2}$ or higher, generation of the crack by the thermal stress is suppressed. Here, the fracture toughness value shows the endurance against the generation of the crack after indent is given on the insulating-ceramic substrate. This value is calculated from dimensions of the indentation and of the cracks generated by the indentation after Vickers indenter is pressed to the point of measurement, by IF method described in JISR1607 (Japan). Namely, in this case, by raising the fracture toughness value of the insulating-ceramic substrate material itself, it cannot be broken easily.

Also in patent document 2 (JP 2005-26252 A), it is indicated that the fracture toughness value of the insulating-ceramic substrate is made higher by bonding a metal circuit plate etc., to the insulating-ceramic substrate. Here, it was shown that the fracture toughness value especially on the face (a face to which the metal circuit plate is bonded) of the insulating-ceramic substrate is increased, by bonding a metal circuit plate, and the endurance against the thermal cycles is improved. In this case, by making the fracture toughness value on the face of the insulating-ceramic substrate high, it becomes hard for a crack to expand forward from a face of the insulating-ceramic substrate, and the substrate becomes hard to be broken.

Patent documents 1: JP 2002-201075 A
Patent documents 2: JP 2005-26252 A

However, semiconductor modules being operated with high electric power are used recently. In this case, corresponding to operation of the semiconductor chip with high electric power, a higher thermal radiation characteristic will be required more for the circuit board, therefore, thicker metal circuit plate or thicker heat sink is used. Therefore, the influence of the thermal expansion difference between the insulating-ceramic substrate and the metal circuit plate or the metal heat sink becomes still greater, and the camber of the substrate during thermal cycles is still larger. In such a case, it was difficult to keep enough endurance of the circuit board only by the aforementioned method.

SUMMARY OF THE INVENTION

This invention is made in view of this problem, and an object of this invention is to provide the invention which solves the above-mentioned problem.

An aspect in accordance with the present invention provides, a circuit board comprising, a insulating-ceramic substrate, a metal circuit plate bonded to one face of the insulating-ceramic substrate, a metal heat sink bonded to another face of the insulating-ceramic substrate, wherein in-plane apparent fracture toughness value of the circuit board is in the range of 3.0-6.5 MPa·m$^{1/2}$.

Moreover, in the circuit board of the present invention, wherein difference between in-plane fracture toughness value of the insulating ceramics and the in-plane apparent fracture toughness value of the circuit board is 3.0 MPa·m$^{1/2}$ or less.

Moreover, in the circuit board of the present invention, wherein an absolute value of amount of camber of the circuit board is 80 μm/inch or less.

Moreover, in the circuit board of the present invention, wherein in-plane fracture toughness value of the insulating-ceramic substrate is 5.5 MPa·m$^{1/2}$ or higher, and thickness of the insulating-ceramic substrate is in the range of 0.2-1.0 mm.

Moreover, in the circuit board of the present invention, wherein the metal circuit plate and the metal heat sink are composed of copper plate with thickness of 0.5 mm-5.0 mm.

Moreover, in the circuit board of the present invention, wherein a ratio of gross area of the metal circuit plate to gross area of said metal heat sink is 5/9 or more.

Moreover, in the circuit board of the present invention, wherein the insulating-ceramic substrate is composed of silicon nitride ceramics.

Another aspect in accordance with the present invention provides a circuit board comprising, a insulating-ceramic substrate, a metal circuit plate bonded to one face of the insulating-ceramic substrate, a metal heat sink bonded to another face of the insulating-ceramic substrate, wherein $(t_1^2-t_2^2)/t_2^2/K<1.5$, here, thickness of the insulating ceramics substrate is $t_c$, thickness of the metal circuit plate is $t_1$, thickness of the metal heat sink is $t_2$, and internal fracture toughness value of the insulating ceramics substrate is K.

Moreover, in the circuit board of the present invention, wherein a ratio of gross area of the metal circuit plate to gross area of the metal heat sink is 5/9 or more.

Moreover, in the circuit board of the present invention, wherein the metal circuit plate and the metal heat sink are composed of copper plate with thickness of 0.5 mm-5.0 mm.

Moreover, in the circuit board of the present invention, wherein the metal circuit plate and the metal heat sink are composed of copper plate with thickness of 0.8-5.0 mm.

Moreover, in the circuit board of the present invention, wherein thickness of the insulating ceramics substrate is in the range of 0.2 mm-1.0 mm.

Moreover, in the circuit board of the present invention, wherein internal apparent fracture toughness value of the circuit board is 4.0 MPa·m$^{1/2}$ or higher.

Moreover, in the circuit board of the present invention, wherein difference between internal fracture toughness value of the insulating-ceramic substrate and the internal apparent fracture toughness value of the circuit board is 2.5 MPa·m$^{1/2}$ or less.

Moreover, in the circuit board of the present invention, wherein the metal circuit plate and the metal heat sink are composed of copper.

Moreover, in the circuit board of the present invention, wherein the insulating-ceramic substrate is composed of silicon nitride ceramics.

Moreover, in the circuit board of the present invention, wherein the metal circuit plate is bonded to the insulating-ceramic substrate and the metal heat sink is bonded to the insulating-ceramic substrate via an active metal brazing material, and bonding temperature is set at 600-900° C.

Another aspect in accordance with the present invention provides, a production method for circuit board to product a circuit board comprising, a insulating-ceramic substrate, a metal circuit plate bonded to one face of the insulating-ceramic substrate, a metal heat sink bonded to another face of the insulating-ceramic substrate, wherein the metal circuit plate is bonded to the insulating-ceramic substrate and the metal heat sink is bonded to the insulating-ceramic substrate via an active metal brazing material, and the bonding temperature is set at 600° C.-900° C.

Moreover, in the production method for circuit board of the present invention, wherein in-plane fracture toughness value of the insulating-ceramic substrate is 5.5 MPa·m$^{1/2}$ or higher, and thickness of the insulating-ceramic substrate is 0.2-1.0 mm.

Moreover, in the production method for circuit board of the present invention, wherein the metal circuit plate and the metal heat sink are composed of copper plate with thickness of 0.5 mm-5.0 mm.

Moreover, in the production method for circuit board of the present invention, wherein a ratio of gross area of the metal circuit plate to gross area of the metal heat sink is 5/9 or more.

Moreover, in the production method for circuit board of the present invention, wherein the insulating-ceramic substrate is composed of silicon nitride ceramics.

Moreover, in the production method for circuit board of the present invention, wherein $(t_1^2-t_2^2)/t_c^2/K<1.5$, here, thickness of the insulating ceramics substrate is $t_c$, thickness of the metal circuit plate is $t_1$, thickness of the metal heat sink is $t_2$, and internal fracture toughness value of the insulating ceramics substrate is K.

Moreover, in the production method for circuit board of the present invention, wherein a ratio of gross area of the metal circuit plate to gross area of the metal heat sink is 5/9 or more.

Moreover, in the production method for circuit board of the present invention, wherein the metal circuit plate and the metal heat sink are composed of copper plate with thickness of 0.5 mm-5.0 mm.

Moreover, in the production method for circuit board of the present invention, wherein the metal circuit plate and the metal heat sink are composed of copper plate with thickness of 0.8 mm-5.0 mm.

Moreover, in the production method for circuit board of the present invention, wherein thickness of the insulating ceramics substrate is in the range of 0.2 mm-1.0 mm.

Moreover, in the production method for circuit board of the present invention, wherein the metal circuit plate and the metal heat sink are composed of copper.

Moreover, in the production method for circuit board of the present invention, wherein the insulating-ceramic substrate is composed of silicon nitride ceramics.

Another aspect in accordance with the present invention provides, a semiconductor module comprising, the circuit board, semiconductor chip mounted on the circuit board.

EFFECT OF THE INVENTION

Since this invention is constituted as mentioned above, even when a thick metal circuit plate and metal heat sink are used, a crack of the insulating-ceramic substrate becomes hard to be generated during thermal cycles, and a circuit board and a semiconductor module with high endurance can be obtained.

DETAILED DESCRIPTION OF THE PREFERRED EMBODIMENTS

Inventors found that the fracture toughness value evaluated in the cross section of an insulating-ceramic substrate has stronger correlation with the endurance of the semiconductor module against thermal cycles, compared to the fracture toughness value evaluated on the surface of the insulating-ceramic substrate. As the fracture toughness value evaluated in this cross section, there are an in-plane apparent fracture toughness value and an internal apparent fracture toughness value. And the composition of the circuit board with high fracture toughness values was invented, and the semiconductor module with high endurance against thermal cycles was obtained by this composition.

Hereafter, the best forms for carrying out this invention are explained.

1st Embodiment

Figure 1:
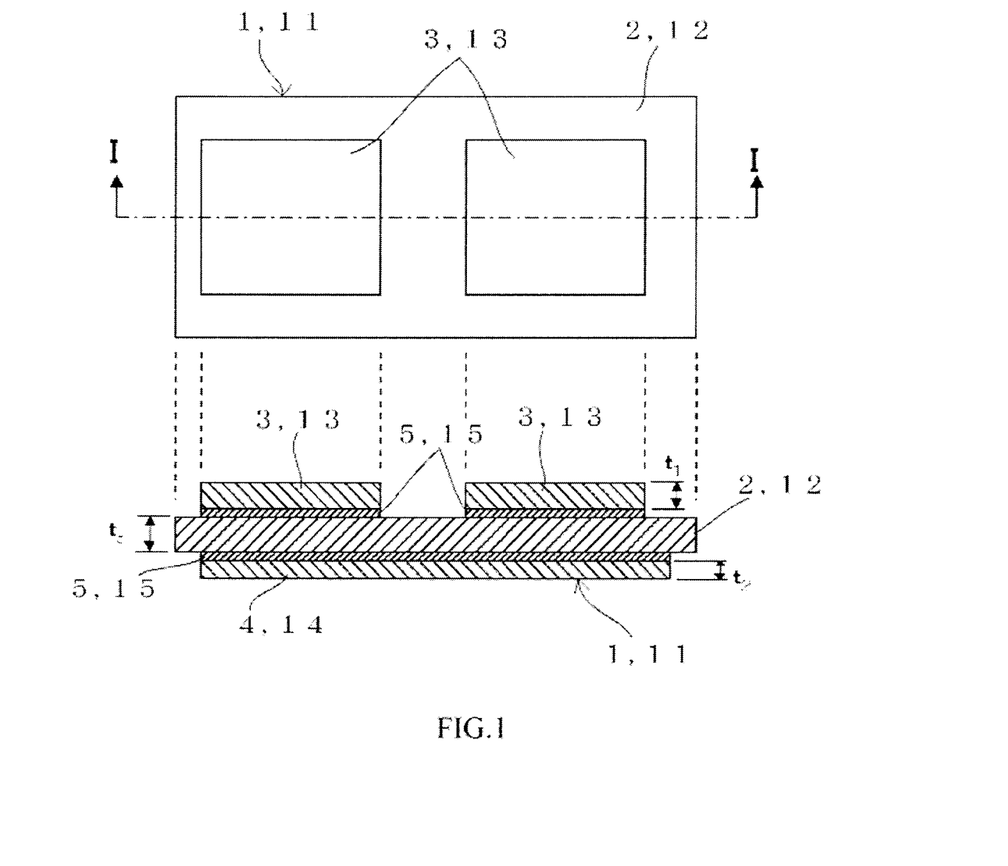
FIG. 1 shows the top view and sectional view of a circuit board concerning 1st and 2nd embodiments of this invention.

Especially a circuit board concerning a 1st embodiment of this invention is effective when the strongly anisotropic insulating-ceramic substrate is used. The top view of this circuit board 1 and the cross sectional view in I-I direction are shown in FIG. 1. In this circuit board 1, metal circuit plate 3 and metal heat sink 4 are bonded to one face and to another face respectively, of the insulating-ceramic substrate 2, via brazing material 5. As insulating-ceramic substrate 2, silicon nitride ceramics are used, for example. Copper is used as metal circuit plate 3 and metal heat sink 4, and the brazing material 5 is composed of an active metal, typically Ag—Cu system alloy to which Ti is doped for example, and by using this, the metal circuit plate 3 and the heat sink 4 are bonded to the insulating-ceramic substrate 2 at the temperature of about 750° C. A semiconductor module using this circuit board 1 is formed by bonding and mounting a semiconductor chip (not shown) with solder on the metal circuit plate 3.

In-plane apparent fracture toughness value $K_{H1}$ of this circuit board 1 is 3.0-6.5 MPa·m$^{1/2}$. $K_{H1}$ is a value showing in-plane expansion of the crack of the insulating-ceramic substrate 2, and this depends on both fracture toughness value of the insulating-ceramic substrate 2 itself and residual stress in the insulating-ceramic substrate 2.

In this invention, what was evaluated in the insulating-ceramic substrate 2 to which the metal circuit plate 3 and the metal heat sink 4 were not bonded, is defined as "in-plane fracture toughness value $K_H$ of the insulating-ceramic substrate 2", and what was evaluated in the insulating-ceramic substrate part of the circuit board 1 to which the metal circuit plate 3 and the metal heat sink 4 were bonded, is defined as "in-plane apparent fracture toughness value $K_{H1}$ of the circuit board 1." In-plane apparent fracture toughness value $K_{H1}$ of the circuit board 1 is determined by the residual stress intensity factor depending on the fracture toughness value of the insulating-ceramic substrate 2, and on the intensity of the residual stress in the insulating-ceramic substrate 2. Therefore, the mechanical property about expansion of the crack in the insulating-ceramic substrate 2 to which the metal circuit plate 3 and the metal heat sink 4 are bonded in the circuit board 1, can be understood using the apparent fracture toughness value. And, a crack generated in the insulating-ceramic substrate 2 by the stress caused by the thermal expansion difference between the insulating-ceramic substrate 2 and the metal plates, may easily expand in the in-plane direction of the insulating-ceramic substrate 2. Then, the circuit board 1 with high reliability using the insulating-ceramic substrate 2 in which in-plane apparent fracture toughness value $K_{H1}$ is set at 3.0 MPa·m$^{1/2}$ or higher, and a crack is made hard to be generated and which is hard to be broken, can be given. If in-plane apparent fracture toughness value $K_{H1}$ is extremely high, when being higher than 6.5 MPa·m$^{1/2}$, the anisotropy of the apparent fracture toughness value is high, therefore apparent fracture toughness value along the thickness direction becomes low, therefore, a crack may extend easily along the thickness direction. Therefore, in-plane apparent fracture toughness value $K_{H1}$ is preferred to be 6.5 MPa·m$^{1/2}$ or lower.

Figure 2:
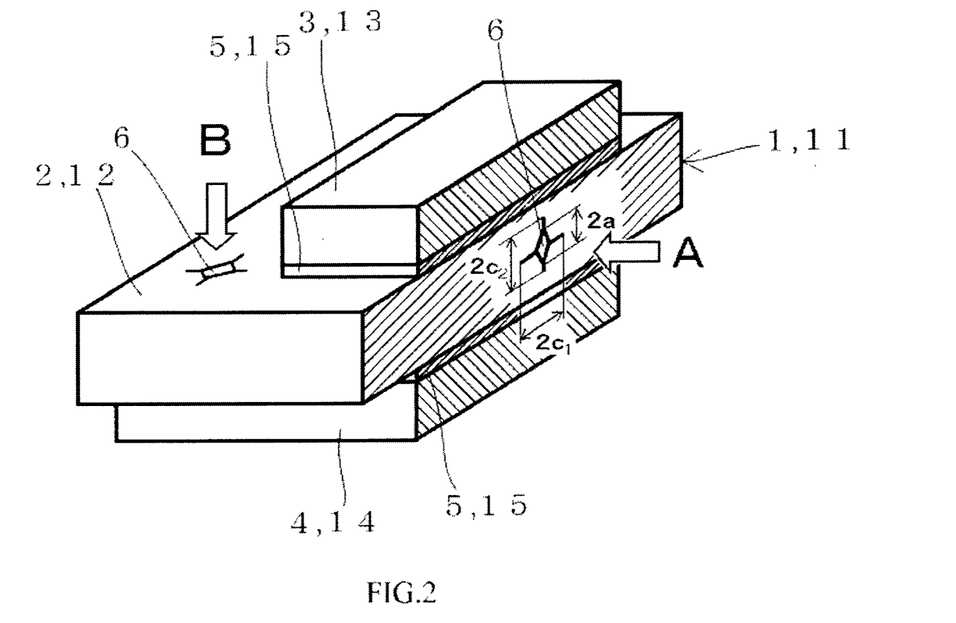
FIG. 2 shows the schematic diagram showing how to measure the fracture toughness value in the circuit board concerning 1st and 2nd embodiments.

The outline of the measuring method of $K_H$ and $K_{H1}$ is shown in FIG. 2. To cross section of insulating-ceramic substrate 2, from the direction shown by "A", by Vickers indenter described in JIS7725 (Japan), a square shaped indentation 6 is formed, so that the directions of diagonal lines are parallel to the in-plane direction (horizontal direction), and thickness direction (vertical direction) respectively. Here, the length of the diagonal lines of the indentation 6 is set equal in both directions, and the lengths are set to be $2a$. The crack in the insulating-ceramic substrate 2 is generated along the direction of these diagonal lines, as shown in FIG. 2, and the length is $2c_1$ along the horizontal direction, and is $2c_2$ along the vertical direction, respectively. Here, according to IF method, described in JISR1607 (Japan), length "c" of the crack was set as, $c=(2c_1-2a)/2$, and the fracture toughness value was calculated as, $K_{H1}=0.026 \times E^{1/2} \times P^{1/2} \times a/c^{3/2}$, using pushing load as "P", elastic modulus of the insulating-ceramic substrate 2 as "E". Thus, the fracture toughness value computed using the horizontal crack is in-plane apparent fracture toughness value $K_{H1}$, or in-plane fracture toughness value $K_H$. These values show the degree of anti-cracking along the horizontal direction of the insulating-ceramic substrate 2. Because $K_{H1}$ depends on the residual stress by the metal circuit plate 3 etc., $K_{H1}$ may be lower than $K_H$. $K_{H1}$ is defined as the value measured as shown in FIG. 2 using the insulating-ceramic substrate 2 on which both the metal circuit plate 3 and the metal heat sink 4 are bonded. On the other hand, $K_H$ is defined as the value measured similarly using the insulating-ceramic substrate 2 without the metal circuit plate 3 and the metal heat sink 4.

As inventors studied wholeheartedly, when in-plane apparent fracture toughness value $K_{H1}$ of the circuit board 1 is 3.0-6.5 MPa·m$^{1/2}$, a crack which extended into the insulating-ceramic substrate 2 from the peripheral part of the metal circuit plate 3 bonded to the insulating-ceramic substrate 2, did not extend more widely, and the substrate was not broken.

Figure 3:
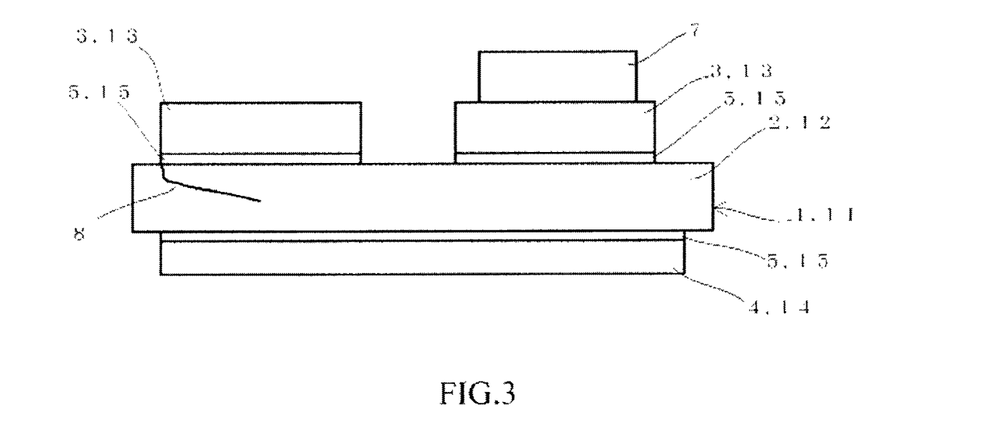
FIG. 3 shows the schematic diagram showing the situation of a crack generated by thermal cycles in the circuit board concerning 1st and 2nd embodiments.

In actual circuit board 1, the schematic diagram of a crack generated during the thermal cycles is shown in FIG. 3. Here, via solder layer (not shown), a semiconductor chip 7 is bonded and mounted on the metal circuit plate 3. A crack 8 is generated near the surface of the peripheral part of the pattern of the metal circuit plate 3 on the insulating-ceramic substrate 2, and generally, this crack may extend horizontally inside the insulating-ceramic substrate 2, as shown in FIG. 3. Because, in the insulating-ceramic substrate 2 to which the metal circuit plate 3 and the metal heat sink 4 are bonded, especially compressive stress may be easily generated along the thickness direction. Here, by making the in-plane apparent fracture toughness value at 3.0 MPa·m$^{1/2}$ or higher, especially horizontal expansion of this crack is suppressed.

Furthermore, the difference between the in-plane fracture toughness value $K_H$ of the insulating-ceramic substrate 2 and the in-plane apparent fracture toughness value $K_{H1}$ of the circuit board 1, $K_H$–$K_{H1}$, is set at 3.0 MPa·m$^{1/2}$ or less. The difference between the in-plane apparent fracture toughness value of the circuit board 1 and the in-plane fracture toughness value of the insulating-ceramic substrate 2, depends on the intensity of the residual stress applied to the insulating-ceramic substrate 2 in the circuit board 1. Therefore, the residual stress applied to the insulating-ceramic substrate 2 was made low by this composition. In this case, the in-plane apparent fracture toughness value of the circuit board 1 becomes 3.0-6.5 MPa·m$^{1/2}$, and a crack which extended into the insulating-ceramic substrate 2 from the peripheral part of the metal circuit plate 3 bonded to the insulating-ceramic substrate 2, did not extend more widely, and the substrate was not broken.

Figure 4:
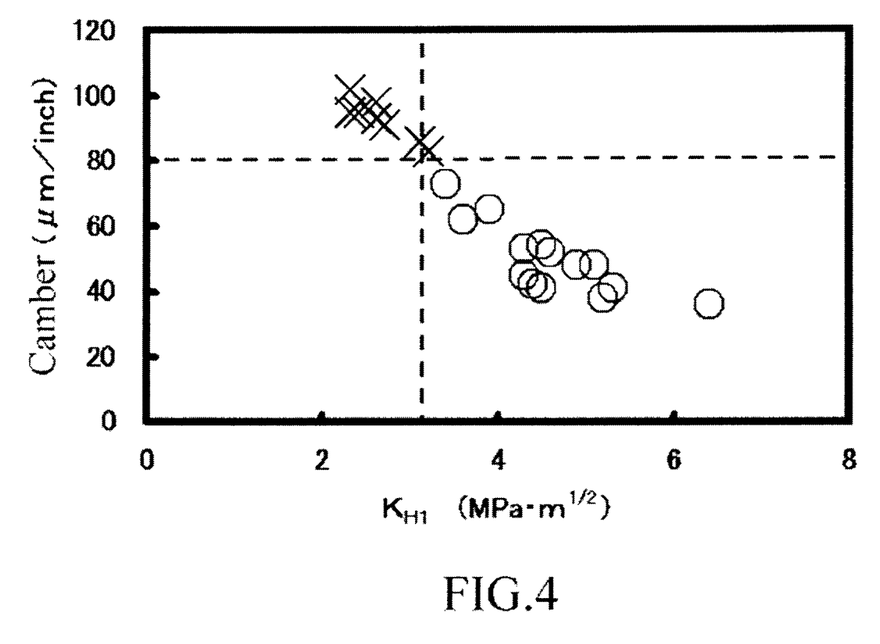
FIG. 4 shows the relation between the amount of camber of a circuit board, and in-plane apparent fracture toughness value $K_{H1}$, in a circuit board concerning a 1st embodiment of this invention.

Furthermore, the amount of camber of the circuit board 1 was made 80 μm/inch (1 inch is 0.0254 m) or less, and the residual stress applied to the insulating-ceramic substrate 2 was made low. In this case, the in-plane apparent fracture toughness value $K_{H1}$ of the circuit board 1 becomes 3.0-6.5 MPa·m$^{1/2}$, and a crack which extended into the insulating-ceramic substrate 2 from the peripheral part of the metal circuit plate 3 bonded to the insulating-ceramic substrate 2, did not extend more widely, and the substrate was not broken. Many circuit boards 1 with various thickness of metal circuit plate 3 etc., were fabricated, and the experimental result on relation between the amount of camber in these and said $K_{H1}$, is shown in FIG. 4. To these circuit boards, 3000 thermal cycles were given and generation of a crack in the insulating-ceramic substrate 2 was investigated. The white round head in FIG. 4 corresponds to the circuit board in which generation of a crack was not found, and "x" corresponds to the circuit board in which a crack was generated. From this result, strong correlation between $K_{H1}$ and the amount of camber is found, especially when $K_{H1}$ is in the range of 3.0-6.5 MPa·m$^{1/2}$, the amount of camber is at 80 μm/inch or less, and higher endurance against thermal cycles can be achieved.

Furthermore, by setting the in-plane fracture toughness value of the insulating-ceramic substrate 2 at 5.5 MPa·m$^{1/2}$ or higher, and also setting the thickness at 0.2 mm or larger, the residual stress applied to the insulating-ceramic substrate 2 was made low. Here, about the lower limit at 0.2 mm, even if the thickness is set at 0.2 mm±0.02 mm, no generation of a crack was found, therefore, this range may be preferred also. In this case, the in-plane apparent fracture toughness value $K_{H1}$ of circuit board 1 becomes 3.0-6.5 MPa·m$^{1/2}$, and a crack which extended into the insulating-ceramic substrate 2 from the peripheral part of the metal circuit plate 3 bonded to the insulating-ceramic substrate 2, did not extend more widely, and the substrate was not broken. For example, the fracture toughness value of silicon nitride ceramics used as the insulating-ceramic substrate 2, depends on species of raw materials, composition and addition of sintering aids, or sintering conditions, etc. Therefore, pillar-shaped particles are grown, and number of grain boundaries and composition of that in ceramics are optimized, and strength of the grain boundaries can be made high, by optimizing these manufacturing conditions. Also, by making crystal grains oriented along a direction and giving anisotropy, a fracture toughness value along a direction can be made high. In order to keep the heat dissipation of the circuit board 1, thickness of the insulating-ceramic substrate 2 may be set at 1.0 mm or less, preferably.

Figure 5:
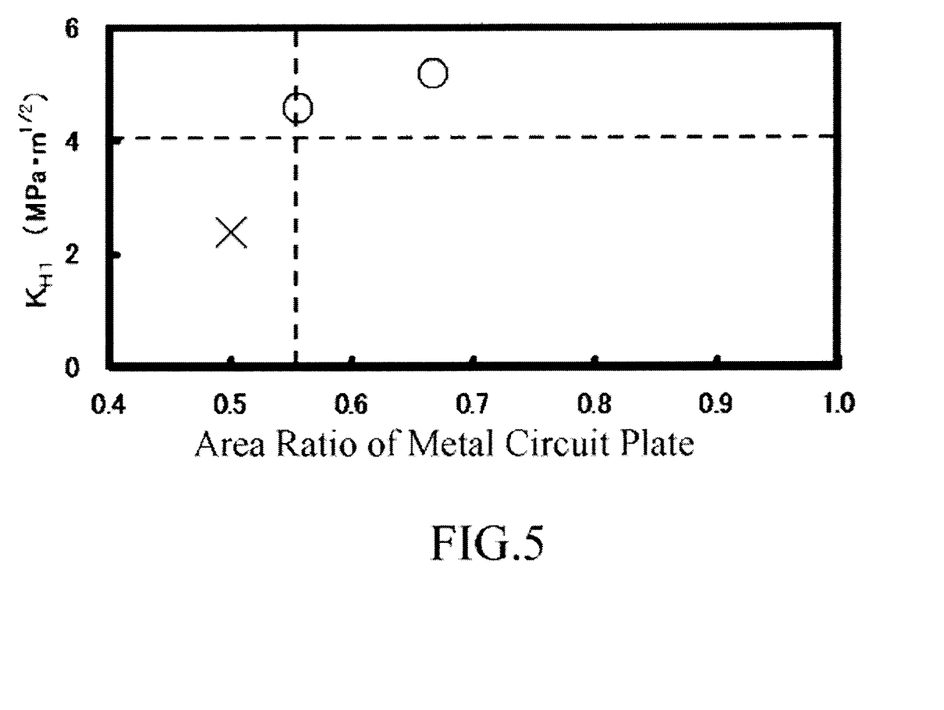
FIG. 5 shows the relation between the ratio of the gross area of a metal circuit plate to the gross area of the metal heat sink, and in-plane apparent fracture toughness value $K_{H1}$, in the circuit board concerning a 1st embodiment of this invention.

A ratio (area ratio) of gross area of the metal circuit plate 3 to gross area of the metal heat sink 4 was set at 5/9 or more. In order to lower the residual stress after bonding of the metal circuit plate 3 and the metal heat sink 4, the structure of the metal circuit plate 3 and the metal heat sink 4 bonded to the insulating-ceramic substrate 2, is preferred to be almost uniform. However, since circuit patterns are formed in the metal circuit plate 3 actually, non-circuit formation part where the metal circuit plate 3 is not bonded and circuit formation part where the metal circuit plate 3 is bonded, are existing on one face of the insulating-ceramic substrate 2. By setting area of the metal circuit plate 3 which equals to this circuit formation part at 5/9 or more of the area of the metal heat sink 4, the residual stress caused by the thermal expansion difference of the insulating-ceramic substrate 2, the metal circuit plate 3, and the metal heat sink 4 can be lowered, therefore, the circuit board 1 with in-plane apparent fracture toughness value $K_{H1}$ of 3.0-6.5 MPa·m$^{1/2}$ and with high reliability can be obtained. In this case, a crack which extended into the insulating-ceramic substrate 2 from the peripheral part of the metal circuit plate 3 bonded to the insulating-ceramic substrate 2, did not extend more widely, and the substrate was not broken. The experimental results on relation between this area ratio and $K_{H1}$ is shown in FIG. 5 as well as FIG. 4. In these results, it is shown that, as this area ratio is smaller, $K_{H1}$ becomes lower, and by setting the area ratio at 5/9 (0.556) or larger, endurance against thermal cycles may be improved.

As for the metal circuit plate 3 and the metal heat sink 4, it is preferred that it is a 0.5-5.0 mm-thick copper plate. By using copper plate with thickness of 0.5 mm or larger as metal circuit plate 3 and metal heat sink 4, the circuit board 1 with high heat dissipation can be obtained, and by setting the thickness at 5.0 mm or less, the residual stress caused by the thermal expansion difference of the insulating-ceramic substrate 2, the metal circuit plate 3, and the metal heat sink 4 can be lowered, and circuit board 1 with in-plane apparent fracture toughness value $K_{H1}$ of 3.0-6.5 MPa·m$^{1/2}$ and with high reliability can be obtained. And endurance against thermal cycles may be improved.

Figure 6:
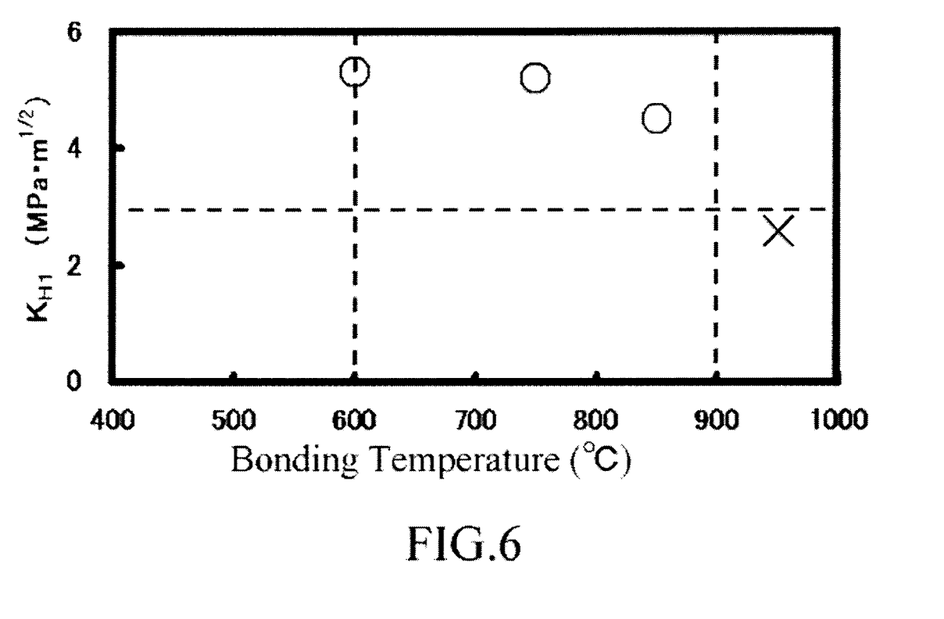
FIG. 6 shows the relation between bonding temperature and in-plane apparent fracture toughness value $K_{H1}$, in the circuit board concerning a 1st embodiment of this invention.

And, bonding between the insulating-ceramic substrate 2 and the metal circuit plate 3, and bonding between the insulating-ceramic substrate 2 and the metal heat sink 4, were carried out via brazing material 5 which is an active metal, by heating at 600-900° C. In circuit board 1, the residual stress applied to the insulating-ceramic substrate 2 is caused by the thermal expansion difference between the insulating-ceramic substrate 2 and metal plate of the metal circuit plate 3 and of the metal heat sink 4, during the bonding. Therefore, by making bonding temperature low at 900° C. or lower, thermal expansion difference of the insulating-ceramic substrate 2 and the metal plates can be lowered, and the residual stress can be lowered. However, the reliability of the bonding may become insufficient when bonding at the low temperature below 600° C. Then, by bonding the metal plates on the insulating-ceramic substrate 2 via active metal brazing material, and setting the bonding temperature at 600° C.-900° C., residual stress caused by the thermal expansion difference of the insulating-ceramic substrate 2, the metal circuit plate 3, and the metal heat sink 4, can be lowered, and the circuit board 1 with in-plane apparent fracture toughness value $K_{H1}$ of 3.0-6.5 MPa·m$^{1/2}$ and with high reliability can be obtained. In this case, a crack which extended into the insulating-ceramic substrate 2 from the peripheral part of the metal circuit plate 3 bonded to the insulating-ceramic substrate 2, did not extend more widely, and the substrate was not broken. The experimental results on relation between this temperature and $K_{H1}$ is shown in FIG. 6 as well as FIG. 4. In these results, it is shown that, as this temperature is higher, $K_{H1}$ becomes lower, and by setting the temperature at 900° C. or lower, endurance against thermal cycles may be improved.

Thus, especially in this circuit board 1, expansion of a crack generated on the surface of the insulating-ceramic substrate 2 along horizontal direction (parallel direction to the surface) after the crack expands to inside, can be suppressed. Therefore, when a semiconductor module is fabricated by mounting semiconductor chip on this circuit board 1, the endurance of this semiconductor module against thermal cycles becomes high.

Next, a production method of the circuit board 1 concerning this embodiment is explained. Metal brazing material, such as Ag—Cu system alloy paste with Ti doped, which is an active metal, is printed on both faces of the insulating-ceramic substrate 2 (silicon nitride ceramics), and metal (copper) plates with almost same rectangular shape as insulating-ceramic substrate 2 are heated and bonded at temperature of 600° C.-900° C. to both faces. After cooling, the metal circuit plate 3 is formed by carrying out etching process on the metal plate on one face so that it forms circuit pattern. Another metal plate bonded to another face may be used as the metal heat sink 4 without etching process, or may be used as the metal heat sink 4 as patterned similarly. And Ni—P plating is carried on the metal circuit plate 3 and the metal heat sink 4 after the circuit pattern formation, and the circuit board 1 is produced.

A semiconductor module is formed, by mounting a semiconductor chip on above-mentioned circuit board 1. In this semiconductor module, the metal circuit plate 3 and the semiconductor chip are bonded via solder. This semiconductor module has high endurance against thermal cycles.

2nd Embodiment

The circuit board 11 concerning a 2nd embodiment of this invention can be applied irrespective of degree of the anisotropy of the insulating-ceramic substrate. The structure of this circuit board 11 is similar to that of the circuit board 1 concerning a 1st aforementioned embodiment, and that top view and the sectional view in I-I direction are shown in FIG. 1. In this circuit board 11, the metal circuit plate 13 and the metal heat sink 14 are bonded to one face and to another face respectively, of the insulating-ceramic substrate 12, via metal brazing material 15. Here, the thickness of the insulating-ceramic substrate 12 is shown as "$t_c$", the thickness of the metal circuit plate 13 is shown as "$t_1$", and the thickness of the metal heat sink 14 is shown as "$t_2$". The thickness of the brazing material 15 is negligibly small to them. As insulating-ceramic substrate 12, silicon nitride ceramics is used, for example. As metal circuit plate 13 and metal heat sink 14, copper is used, for example. Brazing material 15 is an active metal such as Ag—Cu system alloy in which Ti is doped, for example, by using this, the metal circuit plate 13 and metal heat sink 14 are bonded to the insulating-ceramic substrate 12 at temperature of around 750° C.

Here, the internal apparent fracture toughness value $K_1$ of the circuit board 11 is 4.0 MPa·m$^{1/2}$ or higher. Here, the internal apparent fracture toughness value of the circuit board 11 is measured in the circuit board 11 with a structure in which the metal circuit plate 13 is bonded on one face of the insulating-ceramic substrate 12 and the metal heat sink 14 is bonded on another face of that, by IF method, in which Vickers indenter is pushed to the cross section of the insulating-ceramic substrate 12 along "A" direction in FIG. 2 with a predetermined load (for example 2 kgf) as described in JISR1607 (Japan). Also, the internal fracture toughness value K is a fracture toughness value similarly measured in the insulating-ceramic substrate 12 before the metal circuit plate 13 and the metal heat sink 14 are bonded. These are amounts which show the difficulty of horizontal and vertical expansion of the crack in the insulating-ceramic substrate 12. Although K is determined by characteristics of the insulating-ceramic substrate, $K_1$ depends on the fracture toughness value of the insulating-ceramic substrate 12 itself and on residual stress applied to the insulating-ceramic substrate 12. For example, when tensile residual stress is working, a crack may expand easily especially along a perpendicular direction to the tensile stress, therefore, the internal apparent fracture toughness value $K_1$ becomes low in this case.

Specifically, the internal apparent fracture toughness value $K_1$ is computed like aforementioned in-plane apparent fracture toughness value $K_{H1}$ by the method shown in FIG. 2, after the metal circuit plate 13 and the metal heat sink 14 are bonded to the insulating-ceramic substrate 12. However, the crack length "c" is set as, $c=((2c_1-2a)^2+(2c_2-2a)^2)^{1/2}/2$ instead. Thereby, the fracture toughness values computed from the horizontal crack and the vertical crack are the internal apparent fracture toughness value $K_1$ and the internal fracture toughness value $K_1$ respectively. These are amounts which show the degree of anti-cracking along the horizontal and vertical direction in the insulating-ceramic substrate 12. Inside apparent fracture toughness value $K_1$ depends on the internal fracture toughness value K of the insulating-ceramic substrate 12, and also on thickness of the substrate "$t_c$", thickness of the metal circuit plate 13 "$t_1$", and thickness of the metal heat sink 14 "$t_2$". $K_1$ is defined as the value measured as shown in FIG. 2 using the insulating-ceramic substrate 2 on which both the metal circuit plate 3 and the metal heat sink 4 are bonded. On the other hand, K is defined as the value measured similarly using the insulating-ceramic substrate 2 without the metal circuit plate 3 and the metal heat sink 4.

Figure 7:
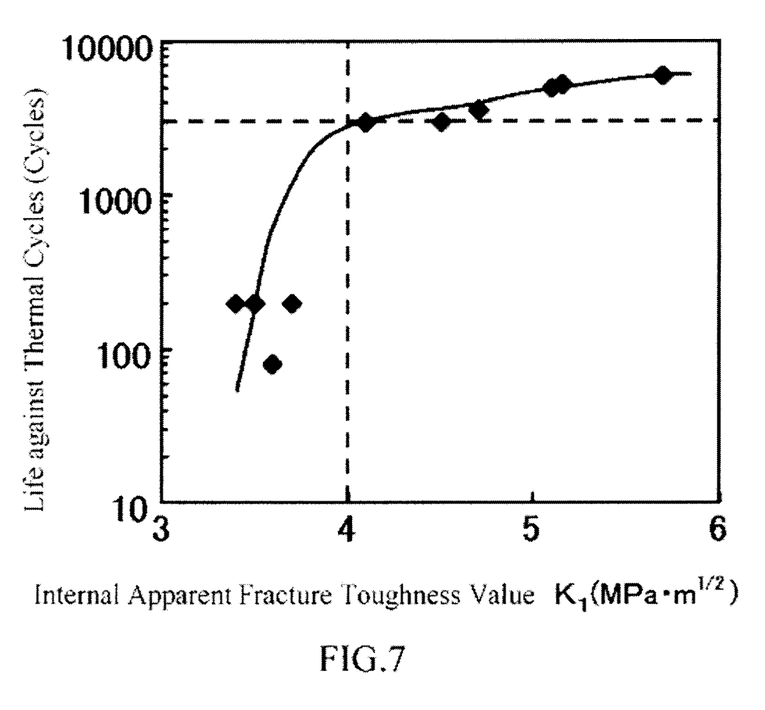
FIG. 7 shows the relation between the life against thermal cycles and internal apparent fracture toughness value $K_1$.

Here, many circuit boards 11 with various internal apparent fracture toughness value $K_1$, by varying "K", "$t_c$", "$t_1$", and "$t_2$", were fabricated. Thermal cycles were applied to these circuit boards 11, and the number of cycles (life) at which the insulating-ceramic substrate 12 was broken, was measured. The experimental results on relation between this life and internal apparent fracture toughness value K1 is shown in FIG. 7. From this result, strong correlation between the life and internal apparent fracture toughness $K_1$ is found. Especially, it was found that, in order to make the life 3000 thermal cycles or longer, the internal apparent fracture toughness value might be set at 4.0 MPa·m$^{1/2}$.

Figure 8:
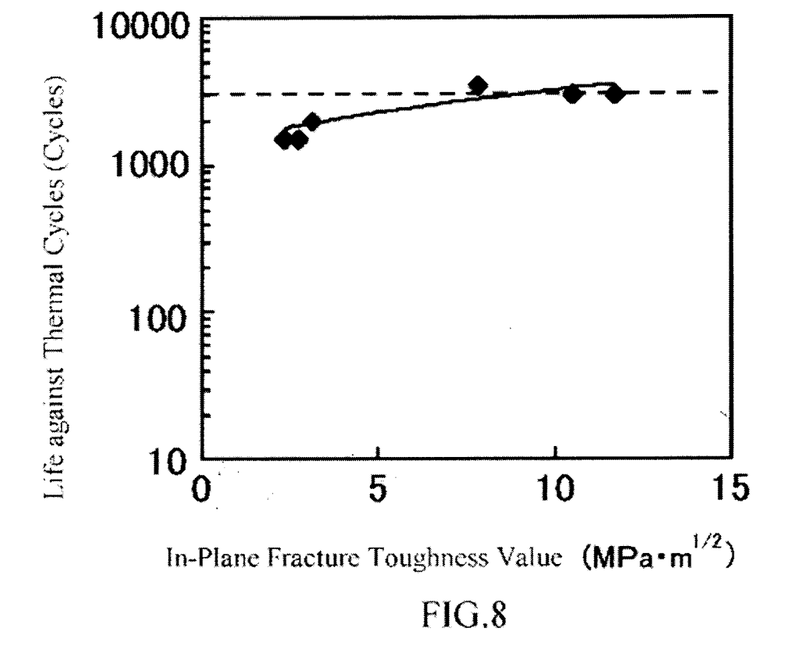
FIG. 8 shows the relation between the life against thermal cycles and the in-plane fracture toughness value.

On the other hand, as indicated in patent documents 2, the in-plane fracture toughness value of the insulating-ceramic substrate 12 also varies by the bonding metal circuit plate 13 and the metal heat sink 14. Here, the in-plane fracture toughness value was calculated by a method in which Vickers indenter was pushed along "B" direction in FIG. 2, to a face of the insulating-ceramic substrate 12, and was calculated by the indent and crack, similarly to the method for aforementioned internal fracture toughness value. The experimental results on relation between this life and the in-plane apparent fracture toughness value is shown in FIG. 8. Weaker correlation than FIG. 7 is found. Thereby, the internal apparent fracture toughness value K1 is more effective on the life, than in-plane fracture toughness value. This fact shows that, when the insulating-ceramic substrate 12 is broken during thermal cycles, the internal expansion of the crack is more effective than the in-plane expansion of the crack.

Therefore, in order to improve the life, it is effective to keep the internal apparent fracture toughness value $K_1$ high. For this purpose, the optimal range exists on the composition of the metal circuit plate 13 and the metal heat sink 14. Generally, the internal apparent fracture toughness value $K_1$ becomes lower than the internal fracture toughness value "K" of the insulating-ceramic substrate 12, by bonding the metal circuit plate 13 and the metal heat sink 14. Because, tensile residual stress is generated inside the insulating-ceramic substrate 12 after the metal circuit plate 13 and the metal heat sink 14 are bonded. Therefore, in order to make this effect weak and to keep internal apparent fracture toughness value $K_1$ high, thickness of the metal circuit plate 13 and the metal heat sink 14, "$t_1$", "$t_2$" should be both small, and should be close to each other. Also, the thickness of the insulating-ceramic substrate 12 "$t_c$" should be large, and the internal fracture toughness value "K" should be large.

Considering aforementioned facts, inventors defined the index "x", as $x=(t_1^2-t_2^2)/t_c^2/K$, here, "$t_c$" is the thickness of the insulating-ceramic substrate 12, "$t_1$" is the thickness of the metal circuit plate 13, "$t_2$" is the thickness of the metal heat sink 14, and "K" is the internal fracture toughness value of the insulating-ceramic substrate 12, to express the aforementioned effect. And when setting as $x<1.5$ (1/MPa·m$^{1/2}$), the internal apparent fracture toughness value $K_1$ of the insulating-ceramic substrate 12 became 4.0 MPa·m$^{1/2}$ or higher, therefore, long life against thermal cycles was obtained in the semiconductor module using this circuit board 11.

Figure 9:
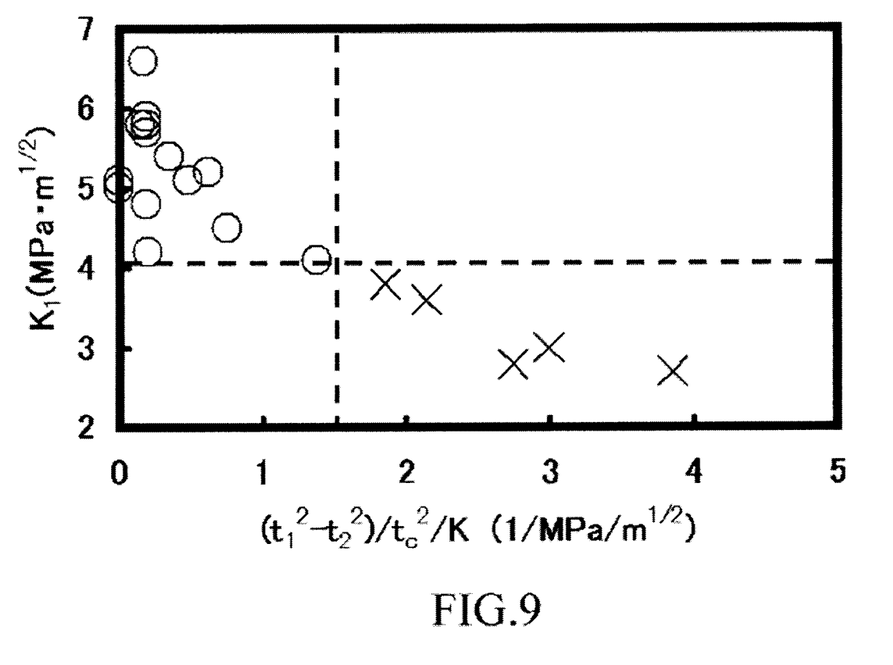
FIG. 9 shows the relation between internal apparent fracture toughness value $K_1$ and "x", in the circuit board concerning a 2nd embodiment of this invention.

When using silicon nitride ceramics substrate with an internal fracture toughness K of 6.5 MPa·m$^{1/2}$ and with a thickness of 0.3 mm as the insulating-ceramic substrate 12, and also bonding the metal circuit plates 13 and the metal heat sinks 14 (both are made of copper) with various thickness, the internal apparent fracture toughness values $K_1$ were measured, and experimental results on relation between the internal apparent fracture toughness value K1 and x, are shown in FIG. 9. Although $K_1$ was always smaller than K, especially it was found that $K_1$ tended to be smaller, as x was large. In the figure, at the point shown by white round head, a crack was not generated even after 3000 thermal cycles, but a crack was generated at the point shown by "x". From these results, by setting $x<1.5$ (1/MPa·m$^{1/2}$), the internal apparent fracture toughness value $K_1$ became 4.0 MPa·m$^{1/2}$ or higher, and a long life against thermal cycles was obtained.

Figure 10:
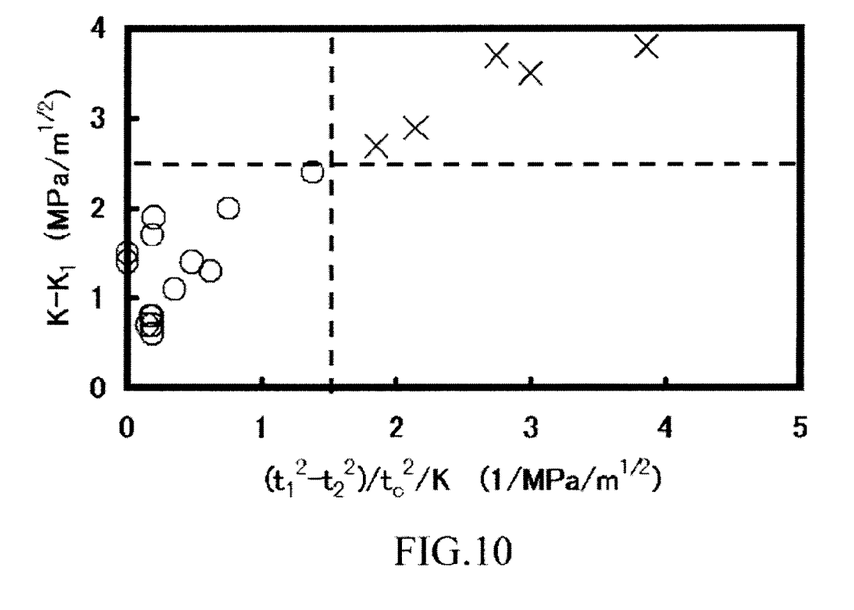
FIG. 10 shows the dependence of $K-K_1$, difference between internal apparent fracture toughness and internal fracture toughness value, on "x", in the circuit board concerning a 2nd embodiment of this invention.

Also, experimental results on relation between difference $K-K_1$ and aforementioned "x" is shown in FIG. 10. $K_1$ is always smaller than K ($K-K_1>0$), and it is found that, when setting $x<1.5$ (1/MPa·m$^{1/2}$), $K-K_1$ becomes 2.5 MPa·m$^{1/2}$ or lower, and a long life against thermal cycles is obtained.

Figure 11:
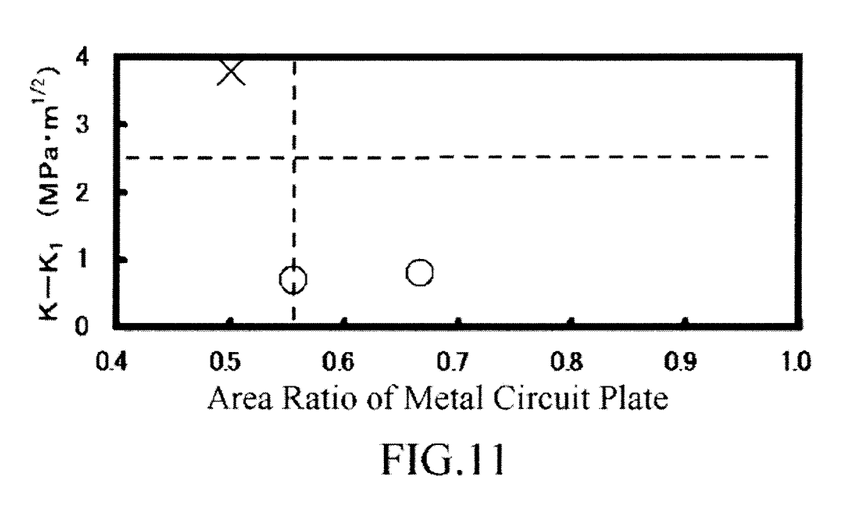
FIG. 11 shows the dependence of area ratio of the gross area of a metal circuit plate to the gross area of the metal heat sink on $K-K_1$, in the circuit board concerning a 2nd embodiment of this invention.

Also, the ratio (area ratio) of the gross area of the metal circuit plate 13 to the gross area of the metal heat sink 14 was set at 5/9 (0.556) or larger. When this ratio is smaller than 5/9, since the residual stress applied to the insulating-ceramic substrate 12 will become high, a long life cannot be obtained. The maximum of this area ratio is 1 obviously by that definition. Many circuit boards 11 with various gross areas of the metal circuit plates 13 were fabricated, and experimental results on the relation between the area ratio and aforementioned $K-K_1$ are shown in FIG. 11. From these results, it is found that, as the area ratio is small, $K-K_1$ becomes large, and by setting the area ratio at 5/9 or larger, a long life against thermal cycles can be obtained.

Thickness of the metal circuit plate 13 and the metal heat sink 14 were in the range of 0.5-5.0 mm. Thermal dissipation is not enough when the thickness is smaller than 0.5 mm, and the volume of the semiconductor module becomes large and becomes heavy and not practical when the thickness is larger than 5.0 mm. For circuit boards used for higher powered semiconductor modules, to improve heat dissipation, thickness of metal circuit plate 13 and metal heat sink 14 shall be 0.8-5.0 mm, and in this case, since the camber of circuit board 11 caused by thermal expansion difference becomes still larger, the effect by setting "x" into the above-mentioned range is remarkable.

Thickness of insulating-ceramic substrate 12 is preferred to be large as aforementioned, although is preferred to be around 0.2-1.0 mm concretely. When being thinner than 0.2 mm, it may be broken easily by thermal stress when the metal circuit plate 13 and the metal heat sink 14 are bonded, even if the fracture toughness is high, and when being thicker than 1.0 mm, the thermal resistance and inductance of the semiconductor module become high, and is not preferred. Here, about the lower limit at 0.2 mm, even if the thickness is set at 0.2 mm±0.02 mm, no generation of a crack was found, therefore, this range may be preferred also. Here, internal fracture toughness values "K" is preferred to be 5.5-7.5 MPa·m$^{1/2}$. Especially silicon nitride ceramics are preferably used as an insulating-ceramic substrate with such characteristics.

Figure 12:
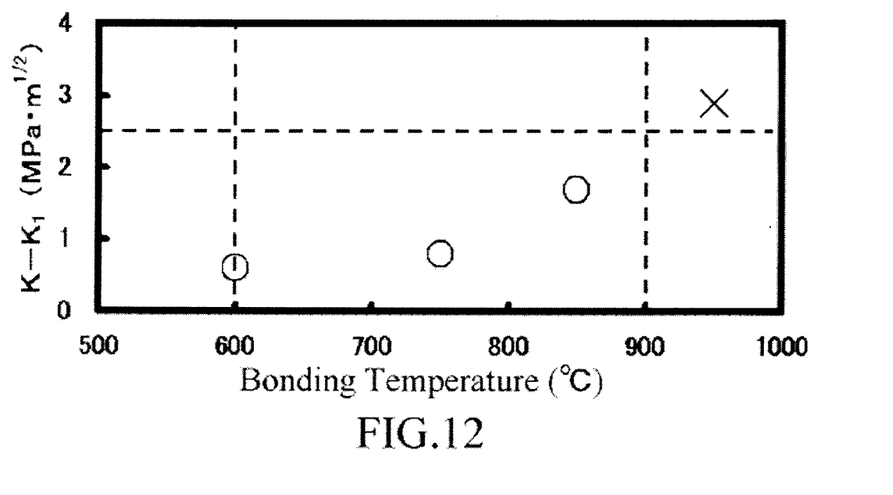
FIG. 12 shows the relation between bonding temperature and $K-K_1$, in the circuit board concerning a 2nd embodiment of this invention.

In this embodiment, the insulating-ceramic substrate 12, and the metal circuit plate 13 and the metal heat sink 14 are bonded via brazing material 15. Brazing material 5 is composed of an active metal, typically Ag—Cu system alloy to which Ti is doped for example. In this case, bonding temperature is preferred to be 600-900° C. When being lower than 600° C., bonding strength will become poor, and when being higher than 900° C., residual stress applied to the insulating-ceramic substrate 12 becomes high, because thermal expansion difference between the insulating-ceramic substrate 12 and the metal circuit plate 13 becomes large. Experimental results on relation between the bonding temperature and aforementioned $K-K_1$ are shown in FIG. 12, similarly to FIG. 11. From these results, as this temperature is high, $K-K_1$ becomes large, and it is found that endurance against thermal cycles is improved by setting the temperature at 900° C. or lower.

The above-mentioned circuit board 11 can be produced by the similar production method as the aforementioned circuit board 1. Also a semiconductor module using this can be fabricated similarly. This semiconductor module has high endurance against thermal cycles.

Although copper was used for the metal circuit plates and the metal heat sinks in each above-mentioned embodiment, these are not restricted, even when other materials with similar characters are used instead, high endurance can be similarly obtained by applying this invention.

In each above-mentioned embodiment, the metal circuit plates and the metal heat sinks were bonded to the insulating-ceramic substrate by brazing material although when other methods are used, high endurance can be obtained similarly.

Also, using other insulating substrates with similar mechanical characteristics instead of the insulating-ceramic substrate, a circuit board with high endurance can be obtained similarly by this invention.

Example

Hereafter, the example of this invention is described. However, this invention is not limited by these examples.

Using silicon nitride ceramics substrates as insulating-ceramic substrates, and using copper plates as metal circuit plates and as metal heat sinks, circuit boards and semiconductor modules were produced. In-plane fracture toughness values K, internal fracture toughness values $K_H$, and thickness of the silicon nitride ceramics substrates, and thickness of the metal circuit plates and the metal heat sinks, are shown in Table 1.

Active metal brazing materials were printed on both faces of the silicon nitride ceramic substrates, and copper plates with almost same rectangular shape as the silicon nitride substrates were heated and bonded to the both faces of silicon nitride ceramic substrates at temperature of 600-900° C. Each temperature (bonding temperature) is shown in Table 1. After cooling, these were etched so that the metal circuit plates and the metal heat sinks might form predetermined patterns, and Ni—P plating was carried on the metal circuit plate and the metal heat sink, and the circuit boards was produced.

Portions to which the metal circuit plates and the metal heat sinks were bonded in the given circuit boards were cut and cross sections were taken, and apparent fracture toughness values were measured based on JISR1607 (Japan) by IF method, in which Vickers indenter was pushed to the cross section of the silicon nitride ceramic substrates with a predetermined load (for example, 2 kgf). Here, Vickers indenter was pushed so that one diagonal line of the Vickers indentation might be vertical to the thickness direction of the substrate. And, by the length of the diagonal line of Vickers indentation along the in-plane direction, the length of a crack expanding from left edge and right edge, and the length of another crack expanding from top edge and bottom edge, in plane apparent fracture toughness value $K_{H1}$ and internal apparent fracture toughness value $K_1$ were calculated. Measurements were performed on five arbitrary places and the average was made into these apparent fracture toughness values. The camber of the circuit board was measured on the diagonal line using the 3-D measuring instrument, and the amount of camber was defined as a maximum displacement divided by the length of the diagonal line. These measured fracture toughness values and the amounts of camber are shown in Table 1.

After semiconductor chips were bonded using solder to the metal circuit plates of the obtained circuit boards, wire bonding was performed and the semiconductor modules were obtained. On these circuit boards and semiconductor modules, as shown below, thermal cycle tests were done. One cycle in the thermal cycle test comprised heating and cooling steps, in which cooling for 20 minutes at −55° C., keeping for 10 minutes at room temperature, and heating for 20 minutes at 150° C. were done. And after 3000 cycles were given, generation of a crack of the silicon nitride ceramic substrates and of a delamination of the metal circuit plates was evaluated. Generation of a crack was investigated by fluorescent crack probing method. It is shown that whether generation of a crack was found or not after the thermal cycle test, in Table 1.

In examples 1-14, the thickness of the silicon nitride ceramics substrates $t_c$ (mm), the internal fracture toughness value K (MPa·m$^{1/2}$), the thickness of the metal circuit plates $t_1$ (mm), and the thickness of the heat sinks $t_2$ (mm), were varied so that $(t_1{}^2 - t_2{}^2)/t_c{}^2/K < 1.5$. The thickness of the metal circuit plates and that of the metal heat sinks were set in the range of 0.5-5.0 mm. Area ratio of the gross area of metal circuit plate to the gross area of the metal heat sink was 5/9 or larger. Bonding temperature was lower than 900° C., and was 600° C. or higher. By these conditions, the in-plane fracture toughness values were set in the range of 3.0-6.5 MPa·m$^{1/2}$.

On the other hand, in comparative examples 1-7, $t_c$, K, $t_1$, and $t_2$ were varied so that $(t_1{}^2 - t_2{}^2)/t_c{}^2/K \geq 1.5$. In comparative example 8, the ratio of the gross area of a metal circuit plate to the gross area of the metal heat sink was made into less than 5/9. In comparative example 9, bonding temperature was 50° C.

Internal apparent fracture toughness value, difference between internal fracture toughness value and internal apparent fracture toughness value, and whether generation of a crack was found or not, in all examples and all comparative examples, are shown in Table 1.

TABLE 1

| | Manufacturing Conditions | | | | | | |
|---|---|---|---|---|---|---|---|
| | Thickness of Silicon Nitride Substrate $t_c$ (mm) | Internal Fracture Toughness Value of Silicon Nitride Substrate K (MPa·m$^{1/2}$) | In-Plane Fracture Toughness Value of Silicon Nitride Substrate $K_H$ (MPa·m$^{1/2}$) | Thickness of Metal Circuit Plate $t_1$ (mm) | Thickness of Metal Heat Sink $t_2$ (mm) | $(t_1{}^2 - t_2{}^2)/t_c{}^2/K$ (1/MPa/m$^{1/2}$) | Area Ratio (Metal Circuit Plate to Metal Heat Sink) |
| Example. 1 | 0.3 | 6.5 | 6.0 | 0.5 | 0.4 | 0.15 | 2/3 |
| Example. 2 | 0.3 | 6.5 | 6.0 | 0.6 | 0.5 | 0.19 | 2/3 |
| Example. 3 | 0.3 | 6.5 | 6.0 | 0.8 | 0.6 | 0.48 | 2/3 |
| Example. 4 | 0.3 | 6.5 | 6.0 | 1.0 | 0.8 | 0.62 | 2/3 |
| Example. 5 | 0.3 | 6.5 | 6.0 | 1.2 | 1.0 | 0.75 | 2/3 |
| Example. 6 | 0.3 | 6.5 | 6.0 | 1.5 | 1.2 | 1.38 | 2/3 |
| Example. 7 | 0.3 | 6.5 | 6.0 | 2.0 | 2.0 | 0.00 | 2/3 |

TABLE 1-continued

|  |  |  |  |  |  |  |  |
|---|---|---|---|---|---|---|---|
| Example. 8 | 0.3 | 6.5 | 6.0 | 2.5 | 2.5 | 0.00 | 2/3 |
| Example. 9 | 0.3 | 6.1 | 5.6 | 0.6 | 0.5 | 0.20 | 2/3 |
| Example. 10 | 0.3 | 7.4 | 7.0 | 0.6 | 0.5 | 0.17 | 2/3 |
| Example. 11 | 0.3 | 6.5 | 6.0 | 0.6 | 0.5 | 0.19 | 5/9 |
| Example. 12 | 0.3 | 6.5 | 6.0 | 0.6 | 0.5 | 0.19 | 2/3 |
| Example. 13 | 0.3 | 6.5 | 6.0 | 0.6 | 0.5 | 0.19 | 2/3 |
| Example. 14 | 0.6 | 6.5 | 6.0 | 1.5 | 1.2 | 0.35 | 2/3 |
| Comparative Example. 1 | 0.3 | 5.1 | 4.8 | 0.6 | 0.5 | 0.24 | 2/3 |
| Comparative Example. 2 | 0.15 | 6.5 | 6.0 | 0.6 | 0.5 | 0.75 | 2/3 |
| Comparative Example. 3 | 0.3 | 6.5 | 6.0 | 1.2 | 0.6 | 1.85 | 2/3 |
| Comparative Example. 4 | 0.3 | 6.5 | 6.0 | 1.5 | 1.0 | 2.14 | 2/3 |
| Comparative Example. 5 | 0.3 | 6.5 | 6.0 | 2.0 | 1.5 | 2.99 | 2/3 |
| Comparative Example. 6 | 0.3 | 6.5 | 6.0 | 2.5 | 2.0 | 3.85 | 2/3 |
| Comparative Example. 7 | 0.3 | 6.5 | 6.0 | 2.2 | 1.8 | 2.74 | 2/3 |
| Comparative Example. 8 | 0.3 | 6.5 | 6.0 | 0.6 | 0.5 | 0.19 | 1/2 |
| Comparative Example. 9 | 0.3 | 6.5 | 6.0 | 0.8 | 0.6 | 0.48 | 2/3 |

| | Measured Values | | | | | |
|---|---|---|---|---|---|---|
| | Manufacturing Conditions Bonding Temperature (°C.) | Internal Apparent Fracture Toughness Value $K_1$ (MPa·m$^{1/2}$) | $K - K_1$ (MPa·m$^{1/2}$) | In-Plane Apparent Fracture Toughness Value $K_{H1}$ (MPa·m$^{1/2}$) | $K_H - K_{H1}$ (MPa·m$^{1/2}$) | Camber of Circuit Board (μm/inch) | Crack after Thermal Cycles |
| Example. 1 | 750 | 5.8 | 0.7 | 4.9 | 1.1 | 48 | not found |
| Example. 2 | 750 | 5.7 | 0.8 | 5.2 | 0.8 | 38 | not found |
| Example. 3 | 750 | 5.1 | 1.4 | 4.3 | 1.7 | 53 | not found |
| Example. 4 | 750 | 5.2 | 1.3 | 4.5 | 1.5 | 41 | not found |
| Example. 5 | 750 | 4.5 | 2.0 | 3.9 | 2.1 | 85 | not found |
| Example. 6 | 750 | 4.1 | 2.4 | 3.4 | 2.6 | 73 | not found |
| Example. 7 | 750 | 5.1 | 1.4 | 4.4 | 1.6 | 42 | not found |
| Example. 8 | 750 | 5.0 | 1.5 | 4.3 | 1.7 | 45 | not found |
| Example. 9 | 750 | 4.2 | 1.9 | 3.6 | 2.0 | 62 | not found |
| Example. 10 | 750 | 6.6 | 0.8 | 6.4 | 0.6 | 36 | not found |
| Example. 11 | 750 | 5.8 | 0.7 | 4.6 | 1.4 | 52 | not found |
| Example. 12 | 600 | 5.9 | 0.6 | 5.3 | 0.7 | 41 | not found |
| Example. 13 | 850 | 4.8 | 1.7 | 4.5 | 1.5 | 54 | not found |
| Example. 14 | 750 | 5.4 | 1.1 | 5.1 | 0.9 | 48 | not found |
| Comparative Example. 1 | 750 | 3.4 | 1.7 | 2.6 | 2.2 | 86 | found |
| Comparative Example. 2 | 750 | 3.0 | 3.5 | 2.7 | 3.3 | 91 | found |
| Comparative Example. 3 | 750 | 3.8 | 2.7 | 3.2 | 2.8 | 63 | found |
| Comparative Example. 4 | 750 | 3.6 | 2.9 | 3.1 | 2.9 | 86 | found |
| Comparative Example. 5 | 750 | 3.9 | 3.5 | 2.6 | 3.4 | 98 | found |
| Comparative Example. 6 | 750 | 2.7 | 38 | 2.3 | 3.7 | 102 | found |
| Comparative Example. 7 | 750 | 2.8 | 3.7 | 2.3 | 3.7 | 95 | found |
| Comparative Example. 8 | 750 | 2.7 | 3.8 | 2.4 | 3.6 | 95 | found |
| Comparative Example. 9 | 950 | 3.6 | 2.9 | 2.6 | 3.4 | 93 | found |

In all comparative examples, crack was generated after the thermal cycles, although no generation of a crack was found in all examples.

What is claimed is:

1. A circuit board comprising, an insulating-ceramic substrate, a metal circuit plate, and a metal heat sink having a thickness which is equal to a thickness of said metal circuit plate, the circuit board having a structure in which, one face of said metal circuit plate is bonded to one face of said insulating-ceramic substrate, one face of said metal heat sink is bonded to another face of said insulating-ceramic substrate, and a ceramic substrate is bonded to neither another face of said metal circuit plate nor another face of said metal heat sink, such that only one insulating-ceramic substrate is used, wherein, an in-plane fracture toughness value of said insulating-ceramic substrate, estimated from a length of a horizontal crack formed by a Vickers indenter on a vertical cross section of said insulating-ceramic substrate alone, is 5.5 MPa·m$^{1/2}$ or higher, a thickness of said insulating-ceramic substrate is in the range of 0.2-1.0 mm, both said metal circuit plate and said metal heat sink are made of copper, and the thickness of said metal circuit plate and the thickness of said metal heat sink are in the range of 0.5-5 mm, a ratio of gross area of said metal circuit plate to gross area of said metal heat sink is 5/9 or more, said metal circuit plate is bonded to said insulating-ceramic substrate and said metal heat sink is bonded to said insulating-ceramic substrate via an active metal brazing filler, and a bonding temperature is set at 600° C.-900° C., an internal fracture toughness value of said insulating-ceramic substrate, estimated from lengths of both horizontal and vertical cracks formed by a Vickers indenter on a vertical cross section of said insulating-ceramic substrate alone, is in the range of 5.5-7.5 MPa·m$^{1/2}$, an in-plane apparent fracture toughness value of said circuit board, estimated from a length of a horizontal crack formed by a Vickers indenter on a vertical cross section of said insulating-ceramic substrate on which both said metal circuit plate and said metal heat sink are bonded, is in the range of 3.0-6.5 MPa·m$^{1/2}$, and an absolute value of an amount of camber of said circuit board is 80 μm/inch or less.

2. The circuit board according to claim 1, wherein a difference between said in-plane fracture toughness value of said insulating-ceramic substrate and said in-plane apparent fracture toughness value of said circuit board is 3.0 MPa·m$^{1/2}$ or less.

3. The circuit board according to claim 1, wherein said insulating-ceramic substrate is composed of silicon nitride ceramics.

4. The circuit board according to claim 1, wherein said metal circuit plate and said metal heat sink each has a thickness in the range of 0.8-5.0 mm.

5. The circuit board according to claim 1, wherein an internal apparent fracture toughness value of said circuit board, estimated from lengths of both horizontal and vertical cracks formed by a Vickers indenter on a vertical cross section of said insulating-ceramic substrate on which both said metal circuit plate and said metal heat sink are bonded, is 4.0 MPa·m$^{1/2}$ or higher.

6. The circuit board according to claim 1, wherein a difference between said internal fracture toughness value of said insulating-ceramic substrate and said internal apparent fracture toughness value of said circuit board is 2.5 MPa·m$^{1/2}$ or less.

7. A production method for circuit board to produce a circuit board comprising, an insulating-ceramic substrate, a metal circuit plate, and a metal heat sink having a thickness which is equal to a thickness of said metal circuit plate, the circuit board having a structure in which, one face of said metal circuit plate is bonded to one face of said insulating-ceramic substrate, one face of said metal heat sink is bonded to another face of said insulating-ceramic substrate, and a ceramic substrate is bonded to neither another face of said metal circuit plate nor another face of said metal heat sink, such that only one insulating-ceramic substrate is used, an in-plane fracture toughness value of said insulating-ceramic substrate, estimated from a length of a horizontal crack formed by a Vickers indenter on a vertical cross section of said insulating-ceramic substrate alone, is 5.5 MPa·m$^{1/2}$ or higher, a thickness of said insulating-ceramic substrate is in the range of 0.2-1.0 mm, both said metal circuit plate and said metal heat sink are made of copper, and the thickness of said metal circuit plate and the thickness of said metal heat sink are in the range of 0.5-5 mm, a ratio of gross area of said metal circuit plate to gross area of said metal heat sink is 5/9 or more, an internal fracture toughness value of said insulating-ceramic substrate, estimated from lengths of both horizontal and vertical cracks formed by a Vickers indenter on a vertical cross section of said insulating-ceramic substrate alone, is in the range of 5.5-7.5 MPa·m$^{1/2}$, and an absolute value of an amount of camber of said circuit board is 80 μm/inch or less, said production method comprising:
bonding said metal circuit plate to said insulating-ceramic substrate; and
bonding said metal heat sink to said insulating-ceramic substrate via an active metal brazing filler, and wherein a bonding temperature is set at 600° C.-900° C.

8. The production method for circuit board according to claim 7, wherein said insulating-ceramic substrate is composed of silicon nitride ceramics.

9. The production method for circuit board according to claim 7, wherein said metal circuit plate and said metal heat sink each has a thickness in the range of 0.8-5.0 mm.

10. A semiconductor module comprising, the circuit board according to claim 1, and a semiconductor chip mounted on said circuit board.

* * * * *